US012813130B2

(12) United States Patent
Bi et al.

(10) Patent No.: US 12,813,130 B2
(45) Date of Patent: Nov. 24, 2026

(54) DISPLAY PANEL, DISPLAY DEVICE, AND MASK

(71) Applicant: BOE Technology Group Co., Ltd., Beijing (CN)

(72) Inventors: Na Bi, Beijing (CN); Lian Xiang, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 525 days.

(21) Appl. No.: 18/283,216

(22) PCT Filed: Jan. 29, 2023

(86) PCT No.: PCT/CN2023/073673
§ 371 (c)(1),
(2) Date: Sep. 21, 2023

(87) PCT Pub. No.: WO2023/160329
PCT Pub. Date: Aug. 31, 2023

(65) Prior Publication Data

US 2024/0298502 A1 Sep. 5, 2024

(30) Foreign Application Priority Data

Feb. 23, 2022 (WO) ................ PCT/CN2022/077463
Mar. 1, 2022 (CN) ......................... 202210195806.5

(51) Int. Cl.
*H10K 59/80* (2023.01)
*C23C 14/04* (2006.01)
(Continued)

(52) U.S. Cl.
CPC ..... *H10K 59/80521* (2023.02); *C23C 14/042* (2013.01); *H10K 59/131* (2023.02); *H10K 71/166* (2023.02)

(58) Field of Classification Search
CPC ........... H10K 59/80521; H10K 59/131; H10K 71/166; H10K 50/813; H10K 50/822; H10K 59/00; H10K 50/82
See application file for complete search history.

(56) References Cited

U.S. PATENT DOCUMENTS 10,629,658 B1 4/2020 Zhang et al.
10,756,136 B1 8/2020 Ma et al.
(Continued)

FOREIGN PATENT DOCUMENTS

CN 102077385 A 5/2011
CN 106098731 A 11/2016
(Continued)

OTHER PUBLICATIONS

International Search Report for PCT/CN2023/073673 Mailed Apr. 27, 2023.
(Continued)

*Primary Examiner* — David Vu

(57) ABSTRACT

A display panel comprises a substrate, and multiple island regions spaced from each other, hole regions provided between adjacent island regions, and bridge regions connecting adjacent island regions, which are provided on the substrate; each island region comprises a structural film layer provided on the substrate and a cathode provided on the side of the structural film layer away from the substrate; the structural film layer comprises at least one effective light emitting region and at least one lap joint region; the cathode comprises at least one cathode portion and at least one lap joint portion; the orthographic projection of the at least one cathode portion on the substrate overlaps with the at least one effective light emitting region; the orthographic projection of the at least one lap joint portion on the substrate
(Continued)

overlaps with the orthographic projection of the at least one lap joint region on the substrate.

20 Claims, 6 Drawing Sheets

(51) Int. Cl.

| | |
|---|---|
| ***H10K 59/131*** | (2023.01) |
| ***H10K 71/16*** | (2023.01) |

(56) References Cited

U.S. PATENT DOCUMENTS

| | | | |
|---|---|---|---|
| 2010/0201673 | A1 | 8/2010 | Kim et al. |
| 2011/0241036 | A1 | 10/2011 | Yoshinaga et al. |
| 2016/0293888 | A1 | 10/2016 | Shim et al. |
| 2018/0190741 | A1 | 7/2018 | Lou |
| 2019/0348488 | A1 | 11/2019 | Terai et al. |
| 2020/0083312 | A1 | 3/2020 | Kim et al. |
| 2020/0135837 | A1 | 4/2020 | Cui et al. |
| 2020/0266246 | A1 | 8/2020 | Bok et al. |
| 2021/0050389 | A1 | 2/2021 | Yang |
| 2021/0320164 | A1 | 10/2021 | Lee et al. |
| 2022/0028335 | A1 | 1/2022 | Matsueda et al. |
| 2022/0238614 | A1 | 7/2022 | Luo et al. |
| 2022/0285476 | A1 | 9/2022 | Li et al. |

FOREIGN PATENT DOCUMENTS

| | | | |
|---|---|---|---|
| CN | 107579102 | A | 1/2018 |
| CN | 109713016 | A | 5/2019 |
| CN | 110061014 | A | 7/2019 |
| CN | 110265461 | A | 9/2019 |
| CN | 110890401 | A | 3/2020 |
| CN | 111596783 | A | 8/2020 |
| CN | 111916464 | A | 11/2020 |
| CN | 112002748 | A | 11/2020 |
| CN | 112310323 | A | 2/2021 |
| CN | 113345929 | A | 9/2021 |
| CN | 113471268 | A | 10/2021 |
| CN | 113517317 | A | 10/2021 |
| CN | 113971935 | A | 1/2022 |
| CN | 217562599 | U | 10/2022 |
| KR | 10-2019-0013167 | A | 2/2019 |
| WO | 2021227744 | A1 | 11/2021 |

OTHER PUBLICATIONS

International Search Report for PCT/CN2022/077463 Mailed Jul. 12, 2022.

DISPLAY PANEL, DISPLAY DEVICE, AND MASK

CROSS-REFERENCE TO RELATED APPLICATIONS

The present application is a U.S. National Phase Entry of International Application PCT/CN2023/073673 having an international filing date of Jan. 29, 2023, which claims priority of Patent Application No. PCT/CN2022/077463 and entitled "Display Substrate, Display Panel and Display Device", and priority of Chinese Patent Application No. 202210195806.5, filed to the CNIPA on Mar. 1, 2022 and entitled "Display Panel, Display Apparatus, and Mask", the contents of which should be interpreted as being incorporated herein by reference.

TECHNICAL FIELD

The embodiments of the present disclosure relate to, but are not limited to, the field of display technologies, and particularly relate to a display panel, a display device, and a mask.

BACKGROUND

Organic Light-Emitting Diode (OLED for short) is a display lighting technology gradually developed in recent years, especially in the display industry, it is one of hot spots in the research field of flat panel displays. Compared with a Liquid Crystal Display (LCD for short), OLED has advantages such as high response, high contrast, low operation voltage, thinness and lightness, flexibility, low energy consumption, low production cost, self-luminescence, wide viewing angle and high response speed.

At present, application fields and product forms of OLED display screens gradually tend to be diversified. Folding screen, curved screen and transparent screen have gradually become research hotspots of OLED panel display industry, among which transparent display technology has been widely studied. Transparent display, as a new display technology, allows a viewer to see a background behind a screen through a display screen. This novel display effect broadens application fields of the display, so it has been widely concerned.

An OLED display panel generally includes a drive circuit layer and a light emitting device. The light emitting device includes an anode, a cathode and a light emitting layer disposed between the anode and the cathode. In the light emitting device, the cathode is evaporated on a whole surface, and a transmittance of cathode material is 50%~60%, which will greatly reduce the light transmittance of a transparent display panel. The transparent display technology generally uses graphical cathode, and the cathode is overlapped with an internal VSS wire to realize current flow and improve an overall light transmittance.

SUMMARY

The following is a summary of subject matter described in the present disclosure in detail. The summary is not intended to limit the protection scope of claims.

In a first aspect, an embodiment of the present disclosure provides a display panel, including a base substrate, and multiple island regions which are disposed on the base substrate and are spaced apart from each other, hole regions disposed between adjacent island regions and bridge regions connecting adjacent island regions, each island region includes a structural film layer disposed on the base substrate and a cathode disposed on a side of the structural film layer away from the base substrate, the structural film layer includes at least one effective light emitting region and at least one lapping region, the cathode includes at least one cathode part and at least one lapping part, wherein an orthographic projection of the at least one cathode part on the base substrate is overlapped with an orthographic projection of the at least one effective light emitting region on the base substrate, and an orthographic projection of the at least one lapping part on the base substrate is overlapped with an orthographic projection of the at least one lapping region on the base substrate.

In an exemplary implementation, the cathode includes one cathode part and one lapping part, and the lapping part is located at a side of the cathode part.

In an exemplary implementation, the cathode includes one first cathode part, one second cathode part, and one lapping part, the first cathode part and the second cathode part are arranged at interval along a first direction, the lapping part is located between the first cathode part and the second cathode part, and the first cathode part and the second cathode part share the lapping part.

In an exemplary implementation, the lapping part is in an elongated strip shape extending along a second direction and the first direction intersects with the second direction.

In an exemplary implementation, the lapping part is in an elongated strip shape extending along the first direction.

In an exemplary implementation, the cathode is in an I-shape.

In an exemplary implementation, the first cathode part and the second cathode part are both rectangular, and a minimum distance between the first cathode part and the second cathode part is 80 um to 100 um.

In an exemplary implementation, the cathode includes one first cathode part, one second cathode part, one third cathode part, one fourth cathode part, and one lapping part, the first cathode part and the second cathode part are arranged at interval along the first direction to form a first column of cathode parts, the third cathode part and the fourth cathode part are arranged at interval along a first direction to form a second column of cathode parts, the first column of cathode parts and the second column of cathode parts are arranged at interval along the second direction, the lapping part is located between the first column of cathode parts and the second column of cathode parts, the first cathode part, the second cathode part, the third cathode part, and the fourth cathode part share the lapping part, and the first direction intersects with the second direction.

In an exemplary implementation, the lapping part is in an elongated strip shape extending along the first direction; or, the lapping part is in an elongated strip shape extending along the second direction; or, an orthographic projection of the lapping part on the base substrate is in a cross-shape.

In an exemplary implementation, the cathode is rectangular.

In an exemplary implementation, a ratio of a length to a width of the cathode is 3 to 1. In an exemplary implementation, a length of the cathode is 450 μm to 550 um and a width of the cathode is 150 μm to 200 um.

In an exemplary implementation, a light transmission region is provided in at least one of following locations: between the first cathode part and the second cathode part, between the second cathode part and the third cathode part, between the third cathode part and the fourth cathode part, and between the fourth cathode part and the first cathode part.

In an exemplary implementation, the at least one effective light emitting region includes a drive circuit layer disposed on the base substrate, an organic dielectric layer disposed on a side of the drive circuit layer away from the base substrate, an anode disposed on a side of the organic dielectric layer away from the base substrate, and a light emitting layer disposed on a side of the anode away from the base substrate, the at least one cathode part is electrically connected with the anode, the anode is connected with the drive circuit layer.

In an exemplary implementation, the at least one effective light emitting region further includes an organic common layer, the organic common layer located on a side of the light emitting layer away from the base substrate, and an orthographic projection of the organic common layer on the base substrate is not overlapped with the orthographic projection of the at least one lapping region on the base substrate.

In an exemplary implementation, the at least one lapping region includes an organic dielectric layer disposed on the base substrate, a power signal lead line disposed on a side of the organic dielectric layer away from the base substrate, and the at least one lapping part is electrically contacted with the power signal lead line.

In a second aspect, an embodiment of the present disclosure further provides a display device, including the aforementioned display panel.

In a third aspect, an embodiment of the present disclosure further provides a mask, the mask is used for manufacturing a cathode in the aforementioned display panel, the mask includes a frame, a support mask disposed on the frame, and a fine metal mask plate disposed on a side of the support mask plate away from the frame, wherein the fine metal mask plate includes at least one opening pattern region, each of the at least one opening pattern region has a same shape as a shape of the cathode.

Other aspects may be understood upon reading and understanding accompanying drawings and detailed description.

DETAILED DESCRIPTION

Figure 1:
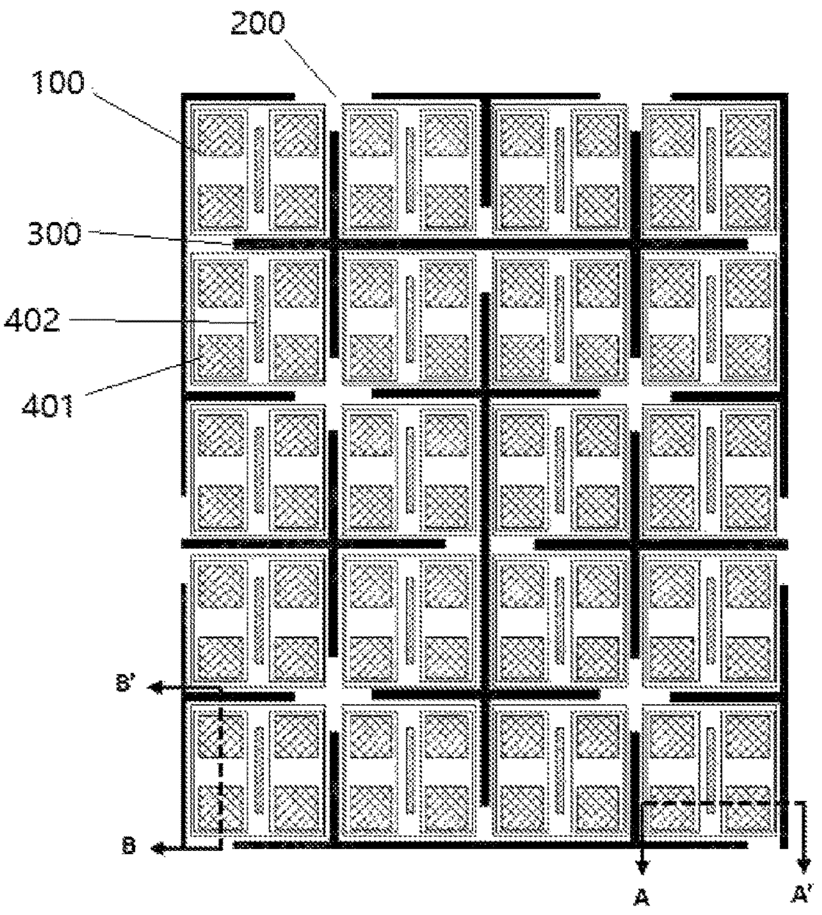
FIG. 1 is a schematic structural diagram of a display panel according to an embodiment of the present disclosure.

Embodiments of the present disclosure will be described in detail below with reference to the accompanying drawings. It is to be noted that implementations may be practiced in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integrated connection; it may be a mechanical connection or an electrical connection; it may be a direct mutual connection, or an indirect connection through a middleware, or internal communication between two elements. Those of ordinary skills in the art may understand meanings of the aforementioned terms in the present disclosure according to situations.

In the present disclosure, "about" refers to that a boundary is defined not so strictly and numerical values within process and measurement error ranges are allowed.

An embodiment of the present disclosure provides a display panel, including a base substrate, multiple island regions which are disposed on the base substrate and are spaced apart from each other, hole regions disposed between adjacent island regions and bridge regions connecting adjacent island regions. Each island region includes a structural film layer disposed on the base substrate and a cathode disposed on a side of the structural film layer away from the base substrate. The structural film layer includes at least one effective light emitting region and at least one lapping region, the cathode includes at least one cathode part and at least one lapping part. An orthographic projection of the at least one cathode part on the base substrate is overlapped with the at least one effective light emitting region, and an orthographic projection of the at least one lapping part on the base substrate is overlapped with an orthographic projection of the at least one lapping region on the base substrate.

In the display panel of the embodiment of the present disclosure, the evaporation area of the cathode is reduced by adjusting positions and sizes of the cathode part and the lapping part in the cathode, which effectively improves the light transmittance of the display panel, and realizes the transparent display technology.

FIG. 1 is a schematic structural diagram of a display panel according to an embodiment of the present disclosure. As shown in FIG. 1, a planar structure of the display panel of the embodiment of the present disclosure includes multiple island regions 100 disposed in an array and spaced apart from each other, hole regions 300 located between adjacent island regions 100, and bridge regions 200 connecting adjacent island regions 100 to each other. The island regions 100 are configured to display an image. The hole regions 300 are configured to provide deformation space during stretching and to form holes through which light is transmitted and the bridge regions 200 are used for routing and transmitting tension force. Each island region 100 may be rectangular or square. A hole region 300 on a periphery of each island region is composed of multiple micropores penetrating the base substrate, the micropores may be cross-shaped or in a shape of multiple connected cross-shapes, and a width of the micropore is from 10 μm to 500 μm. A bridge region 200 is located outside the island region 100 and located between adjacent hole regions 300. The bridge region 200 may be cross-shaped and a width of the bridge region 200 is from 10 μm to 500 μm. The embodiments of the present disclosure are not limited thereto.

In an exemplary embodiment, isolation grooves or isolation columns are provided around the hole regions 300 to isolate water oxygen from erosion of the evaporation material in the island regions 100 by water oxygen.

Figure 2:
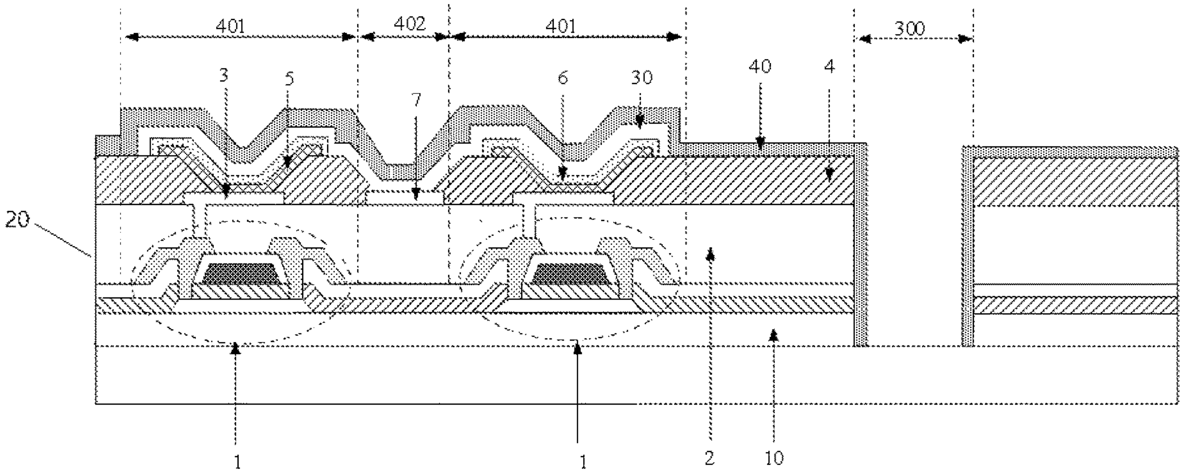
FIG. 2 is a first sectional view of a display panel according to an embodiment of the present disclosure.
Figure 3:
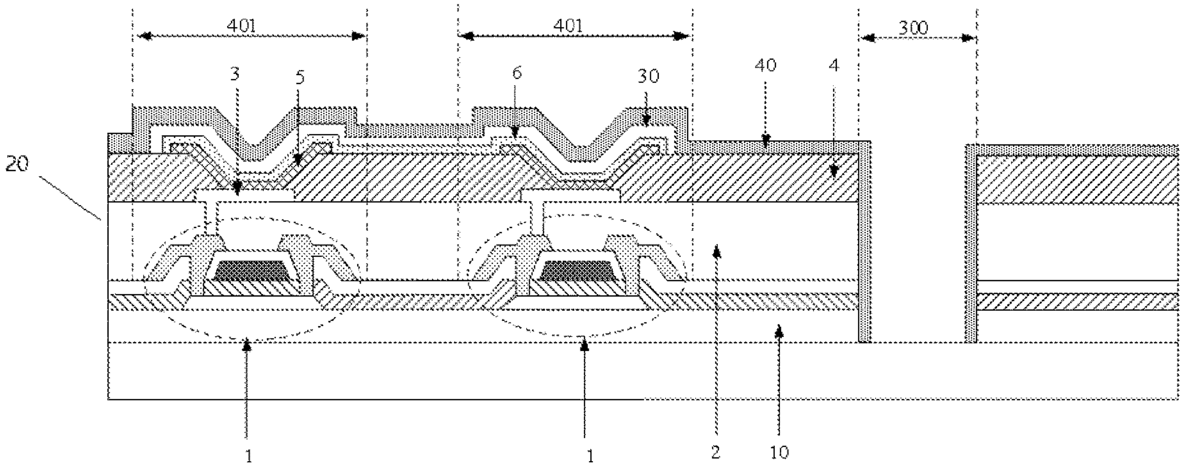
FIG. 3 is a second sectional view of a display panel according to an embodiment of the present disclosure.

FIG. 2 is a first sectional view of a display panel according to an embodiment of the present disclosure. FIG. 3 is a second sectional view of a display panel according to an embodiment of the present disclosure. FIG. 2 is a sectional view taken along an A-A' direction in FIG. 1, and FIG. 3 is a sectional view taken along a B-B' direction in FIG. 1. In an exemplary embodiment, as shown in FIG. 1, FIG. 2, and FIG. 3, in a plane perpendicular to the display panel, each island region 100 includes a structural film layer 20 disposed on the base substrate 10, a cathode 30 disposed on a side of the structural film layer 20 away from the base substrate, and an encapsulation layer 40 disposed on a side of the cathode 30 away from the base substrate. The structural film layer 20 includes at least one effective light emitting region 401 and at least one lapping region 402. The cathode 30 includes at least one cathode part and at least one lapping part. An orthographic projection of the at least one cathode part on the base substrate 10 is overlapped with an orthographic projection of the at least one effective light emitting region 401 on the base substrate 10. An orthographic projection of the at least one lapping part on the base substrate 10 is overlapped with an orthographic projection of the at least one lapping region 402 on the base substrate 10.

In an exemplary embodiment, as shown in FIG. 1, FIG. 2, and FIG. 3, the structural film layer 20 of an island region 100 includes a first effective light emitting region, a second effective light emitting region, a third effective light emitting region, a fourth effective light emitting region, and a lapping region 402. Each effective light emitting region includes a drive circuit layer 1 disposed on a base substrate 10, an organic dielectric layer 2 disposed on a side of the drive circuit layer 1 away from the base substrate, an anode 3 disposed on a side of the organic dielectric layer 2 away from the base substrate 10, a pixel definition layer 4, a light emitting layer 5, and an organic common layer 6 disposed on a side of the anode 3 away from the base substrate 10. A first opening is provided in the pixel definition layer 4, the first opening exposes the anode 3, and the light emitting layer 5 and the organic common layer 6 cover the first opening. The light emitting layer 5 is located on the side of the anode 3 away from the base substrate 10 and electrically connected with the anode 3. The organic common layer 6 is located on a side of the light emitting layer 5 away from the base substrate 10. The drive circuit layer 1 mainly includes multiple Thin Film Transistors (TFT for short). The lapping region 402 includes an organic dielectric layer 2 disposed on the base substrate 10, and a power signal lead line 7 disposed on a side of the organic dielectric layer 2 away from the base substrate 10. An orthographic projection of the power signal lead line 7 on the base substrate 10 is not overlapped with an orthographic projection of the pixel definition layer 4 on the base substrate 10, i.e., a second opening is provided in the pixel definition layer 4, and the second opening exposes the power signal lead line 7. The lapping part of the cathode 30 is electrically contacted with the power signal lead line 7 through the second opening. An orthographic projection of the organic common layer 6 on the base substrate 10 is not overlapped with the orthographic projection of the at least one lapping region 402 on the base substrate 10.

In an exemplary implementation, a type of the thin film transistors is not specifically limited in the embodiments of the present disclosure and may be for example a monocrystalline silicon thin film transistor, a low temperature polysilicon thin film transistor, or an oxide thin film transistor. For example, in order to reduce a size of the thin film transistor, it is preferable to use a low temperature polysilicon thin film transistor, which is beneficial to improving a transparent display effect of the display panel. In addition, when the thin film transistor is made small, a light emitting unit can be made small, which is also beneficial to improving resolution of a transparent display panel.

In an exemplary implementation, the cathode 3 is made of metal, such as silver, aluminum or the like, which is not limited in the embodiments of the present disclosure thereto.

In an exemplary implementation, the anode 30 is made of a transparent conductive material, such as indium tin oxide, zinc tin oxide or the like, which is not limited in the embodiments of the present disclosure thereto.

In an exemplary implementation, a material of the base substrate 10 includes glass, plastic, or flexible base substrate material. The flexible base substrate material includes one or more of polyimide (PI), polyethersulfone (PES), polyacrylate (PAR), polyetherimide (PEI), polyethylene naphthalate (PEN), polyethylene terephthalate (PET), polyphenylene sulfide (PPS), Polyallylate, polycarbonate (PC), cellulose triacetate (TAC), cellulose acetate propionate (CAP) or Acrylamide. Because polyimide is one of the organic polymer materials with the best comprehensive performance, the flexible material has good optical, chemical resistance, water and oxygen resistance and other properties, therefore, the material of the base substrate in the display panel of this embodiment may be selected as polyimide.

Figure 4:
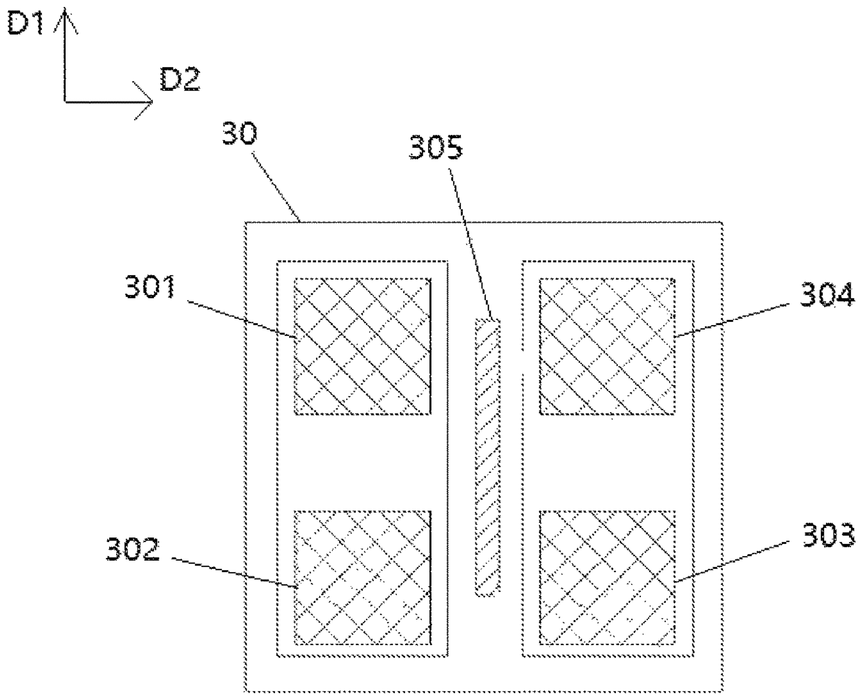
FIG. 4 is a first schematic structural diagram of a cathode of an island region in a display panel according to an embodiment of the present disclosure.

FIG. 4 is a first schematic structural diagram of a cathode of an island region in a display panel according to an embodiment of the present disclosure. In an exemplary implementation, as shown in FIG. 4, a cathode 30 of an island region 100 in the display panel of an embodiment of the present disclosure is a patterned cathode. The cathode 30 may be rectangular and the cathode 30 includes a first cathode part 301, a second cathode part 302, a third cathode part 303, a fourth cathode part 304 and a lapping part 305. An orthographic projection of the first cathode part 301 on the base substrate 10 is overlapped with an orthographic projection of a first effective light emitting region on the base substrate 10. An orthographic projection of the second cathode part 302 on the base substrate 10 is overlapped with an orthographic projection of a second effective light emitting region on the base substrate 10. An orthographic projection of the third cathode part 303 on the base substrate 10 is overlapped with an orthographic projection of a third effective light emitting region on the base substrate 10. An orthographic projection of the fourth cathode part 304 on the base substrate 10 is overlapped with an orthographic projection of a fourth effective light emitting region on the base substrate 10. An orthographic projection of the lapping part 305 on the base substrate 10 is overlapped with an orthographic projection of a lapping region 402 on the base substrate 10. The first cathode part 301, the second cathode part 302, the third cathode part 303, and the fourth cathode part 304 are all rectangular. The first cathode part 301 and the second cathode part 302 are arranged at interval along a first direction D1 to form a first column of cathode parts, the third cathode part 303 and the fourth cathode part 304 are arranged at interval along the first direction D1 to form a second column of cathode parts, and the first column of cathode parts and the second column of cathode parts are arranged at interval along a second direction D2. The lapping part 305 is in an elongated strip shape extending along the first direction D1 and the lapping part 305 is located between the first column of cathode parts and the second column of cathode parts. The first cathode part 301, the second cathode part 302, the third cathode part 303, and the fourth cathode part 304 share the lapping part 305, that is, the first cathode part 301, the second cathode part 302, the third cathode part 303, and the fourth cathode part 304 are electrically connected with the power signal lead line 7 of the lapping region 402 through the lapping part 305. The first direction D1 intersects with the second direction D2, for example, the first direction D1 is perpendicular to the second direction D2.

Figure 5:
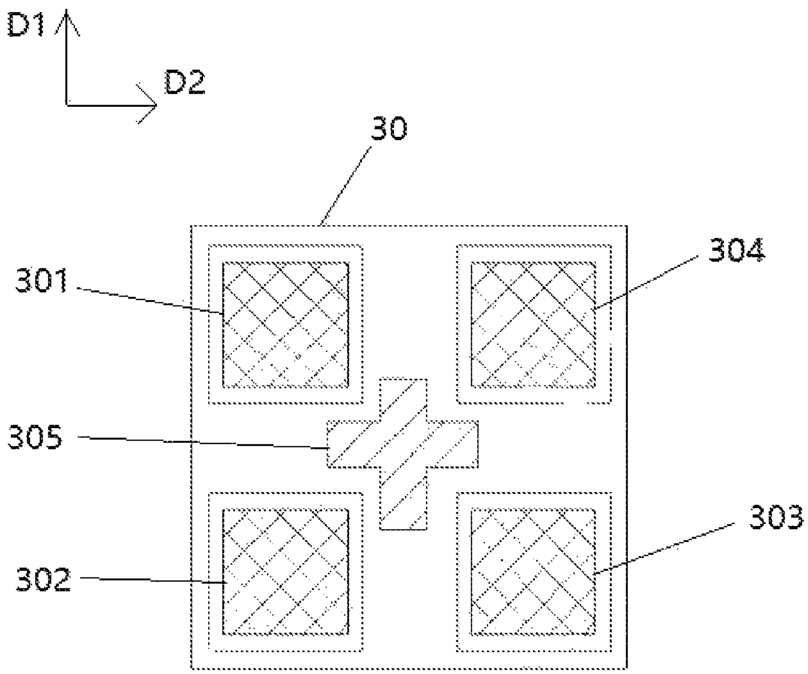
FIG. 5 is a second schematic structural diagram of a cathode of an island region in a display panel according to an embodiment of the present disclosure.

FIG. 5 is a second schematic structural diagram of a cathode of an island region in a display panel according to an embodiment of the present disclosure. In an exemplary implementation, as shown in FIG. 5, the cathode 30 may be rectangular, and the cathode 30 includes a first cathode part 301, a second cathode part 302, a third cathode part 303, a fourth cathode part 304, and a lapping part 305. An orthographic projection of the first cathode part 301 on the base substrate 10 is overlapped with an orthographic projection of a first effective light emitting region on the base substrate 10. An orthographic projection of the second cathode part 302 on the base substrate 10 is overlapped with an orthographic projection of a second effective light emitting region on the base substrate 10. An orthographic projection of the third cathode part 303 on the base substrate 10 is overlapped with an orthographic projection of a third effective light emitting region on the base substrate 10. An orthographic projection of the fourth cathode part 304 on the base substrate 10 is overlapped with an orthographic projection of the fourth effective light emitting region on the base substrate 10. An orthographic projection of the lapping part 305 on the base substrate 10 is overlapped with an orthographic projection of a lapping region 402 on the base substrate 10. The first cathode part 301, the second cathode part 302, the third cathode part 303, and the fourth cathode part 304 are all rectangular. The first cathode part 301 and the second cathode part 302 are arranged at interval along the first direction D1 to form a first column of cathode parts, the third cathode part 303 and the fourth cathode part 304 are arranged at interval along the first direction D1 to form a second column of cathode parts, and the first column of cathode parts and the second column of cathode parts are arranged at interval along the second direction D2. The orthographic projection of the lapping part 305 on the base substrate 10 is in a cross-shape and the lapping part is located between the first column of cathode parts and the second column of cathode parts. The first cathode part 301, the second cathode part 302, the third cathode part 303, and the fourth cathode part 304 share the lapping part 305, that is, the first cathode part 301, the second cathode part 302, the third cathode part 303, and the fourth cathode part 304 are electrically connected with the power signal lead line 7 of the lapping region 402 through the lapping part 305. The first direction D1 intersects with the second direction D2, for example, the first direction D1 is perpendicular to the second direction D2. In some embodiments, the lapping part may also be in an elongated strip shape extending along the second direction D2.

Figure 6:
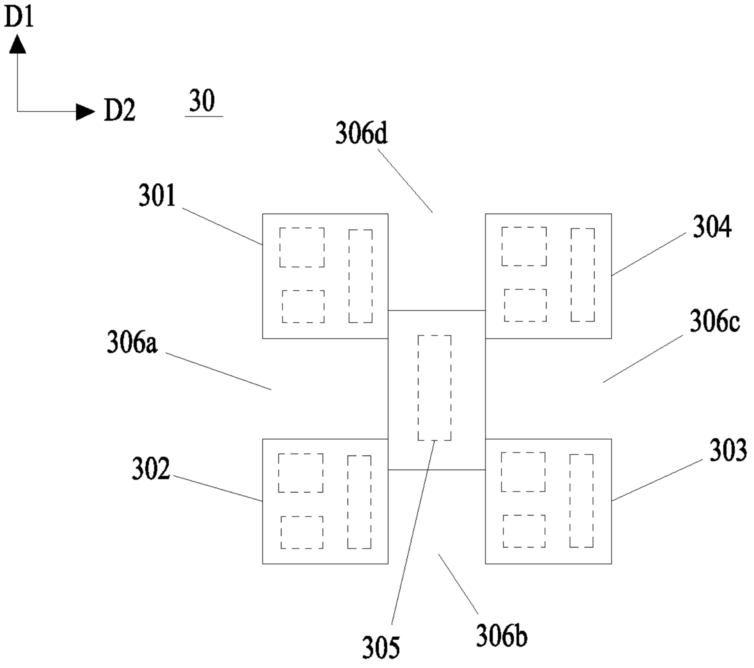
FIG. 6 is a third schematic structural diagram of a cathode of an island region in a display panel according to an embodiment of the present disclosure.

FIG. 6 is a third schematic structural diagram of a cathode of an island region in a display panel according to an embodiment of the present disclosure. In an exemplary implementation, as shown in FIG. 6, the cathode 30 includes a first cathode part 301, a second cathode part 302, a third cathode part 303, a fourth cathode part 304, and a lapping part 305. An orthographic projection of the first cathode part 301 on the base substrate 10 is overlapped with an orthographic projection of a first effective light emitting region on the base substrate 10. An orthographic projection of the second cathode part 302 on the base substrate 10 is overlapped with an orthographic projection of a second effective light emitting region on the base substrate 10. An orthographic projection of the third cathode part 303 on the base substrate 10 is overlapped with an orthographic projection of a third effective light emitting region on the base substrate 10. An orthographic projection of the fourth cathode part 304 on the base substrate 10 is overlapped with an orthographic projection of a fourth effective light emitting region on the base substrate 10. An orthographic projection of the lapping part 305 on the base substrate 10 is overlapped with an orthographic projection of a lapping region 402 on the base substrate 10. The first cathode part 301, the second cathode part 302, the third cathode part 303, and the fourth cathode part 304 are all rectangular. The first cathode part 301 and the second cathode part 302 are arranged at interval along the first direction D1 to form a first column of cathode parts, the third cathode part 303 and the fourth cathode part 304 are arranged at interval along the first direction D1 to form a second column of cathode parts, and the first column of cathode parts and the second column of cathode parts are arranged at interval along the second direction D2. The lapping part 305 is in an elongated strip shape extending along the first direction D1 and the lapping part 305 is located between the first column of cathode parts and the second column of cathode parts. The first cathode part 301, the second cathode part 302, the third cathode part 303, and the fourth cathode part 304 share the lapping part 305, that is, the first cathode part 301, the second cathode part 302, the third cathode part 303, and the fourth cathode part 304 are electrically connected with the power signal lead line 7 of the lapping region 402 through a lapping part 305.

In the display panel of the embodiment of the present disclosure, a light transmission region is provided in at least one of the following regions: between the first cathode part 301 and the second cathode part 302, between the second cathode part 302 and the third cathode part 303, between the third cathode part 303 and the fourth cathode part 304, and between the fourth cathode part 304 and the first cathode part 301. For example, a first light transmission region 306*a* is disposed between the first cathode part 301 and the second cathode part 302, a second light transmission region 306*b* is disposed between the second cathode part 302 and the third cathode part 303, a first light transmission region 306*c* is disposed between the third cathode part 303 and the fourth cathode part 304, and a first light transmission region 306*d* is disposed between the fourth cathode part 304 and the first cathode part 301, as shown in FIG. 6.

Figure 7:
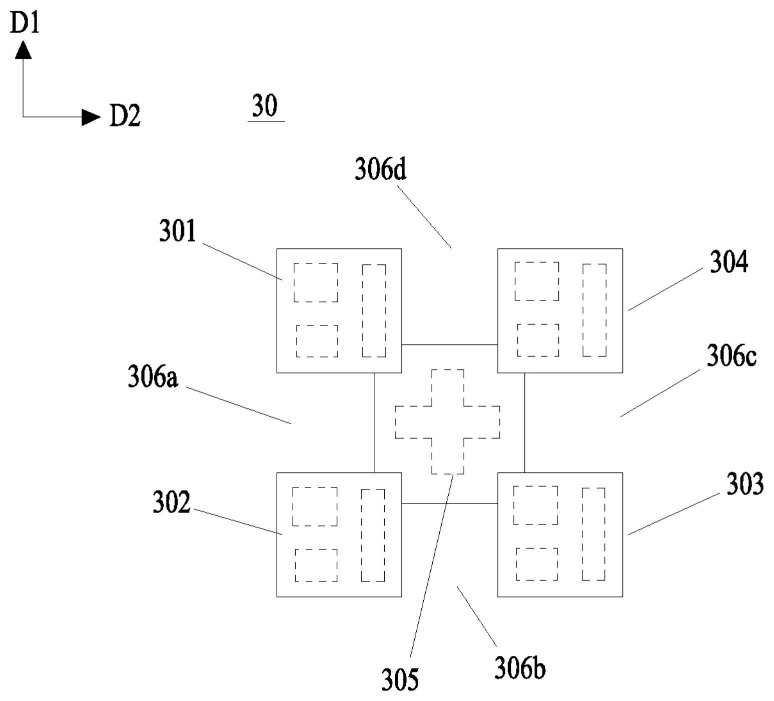
FIG. 7 is a fourth schematic structural diagram of a cathode of an island region in a display panel according to an embodiment of the present disclosure.

FIG. 7 is a fourth schematic structural diagram of a cathode of an island region in a display panel according to an embodiment of the present disclosure. In an exemplary implementation, as shown in FIG. 7, the cathode 30 includes a first cathode part 301, a second cathode part 302, a third cathode part 303, a fourth cathode part 304, and a lapping part 305. An orthographic projection of the first cathode part 301 on the base substrate 10 is overlapped with an orthographic projection of a first effective light emitting region on the base substrate 10. An orthographic projection of the second cathode part 302 on the base substrate 10 is overlapped with an orthographic projection of a second effective light emitting region on the base substrate 10. An orthographic projection of the third cathode part 303 on the base substrate 10 is overlapped with an orthographic projection of a third effective light emitting region on the base substrate 10. An orthographic projection of the fourth cathode part 304 on the base substrate 10 is overlapped with an orthographic projection of a fourth effective light emitting region on the base substrate 10. An orthographic projection of the lapping part 305 on the base substrate 10 is overlapped with the orthographic projection of the lapping region 402 on the base substrate 10. The first cathode part 301, the second cathode part 302, the third cathode part 303, and the fourth cathode part 304 are all rectangular. The first cathode part 301 and the second cathode part 302 are arranged at interval along the first direction D1 to form a first column of cathode parts, the third cathode part 303 and the fourth cathode part 304 are arranged at interval along the first direction D1 to form a second column of cathode parts, and the first column of cathode parts and the second column of cathode parts are arranged at interval along the second direction D2. The orthographic projection of the lapping part 305 on the base substrate 10 is in a cross-shape and the lapping part is located between the first column of cathode parts and the second column of cathode parts. The first cathode part 301, the second cathode part 302, the third cathode part 303, and the fourth cathode part 304 share the lapping part 305, that is, the first cathode part 301, the second cathode part 302, the third cathode part 303, and the fourth cathode part 304 are electrically connected with the power signal lead line 7 of the lapping region 402 through the lapping part 305.

In the display panel of the embodiment of the present disclosure, a light transmission region is provided in at least one of the following regions: between the first cathode part 301 and the second cathode part 302, between the second cathode part 302 and the third cathode part 303, between the third cathode part 303 and the fourth cathode part 304, and between the fourth cathode part 304 and the first cathode part 301. For example, a first light transmission region 306*a* is disposed between the first cathode part 301 and the second cathode part 302, a second light transmission region 306*b* is disposed between the second cathode part 302 and the third cathode part 303, a first light transmission region 306*c* is disposed between the third cathode part 303 and the fourth cathode part 304, a first light transmission region 306*d* is disposed between the fourth cathode part 304 and the first cathode part 301 to reduce an evaporation area of the cathode 30 and improve the light transmittance of the display panel, as shown in FIG. 7. In some embodiments, the lapping part may also be in an elongated strip shape extending along the second direction D2.

Figure 8:
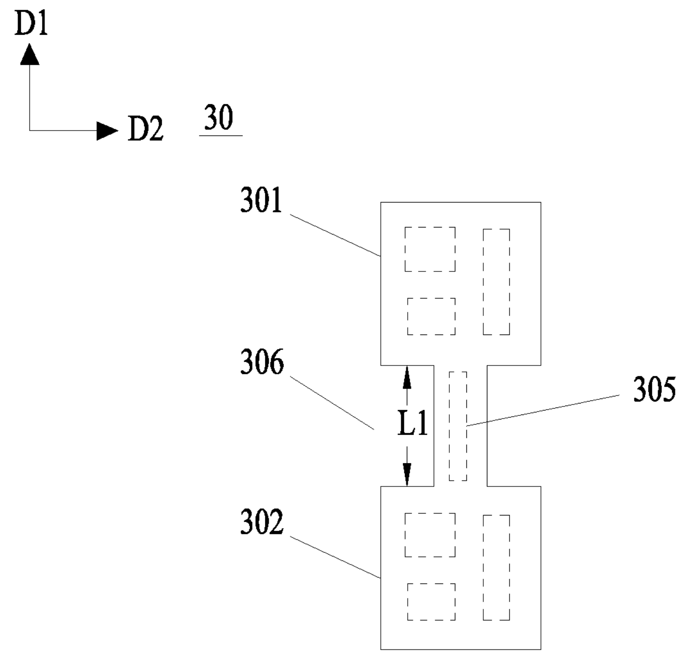
FIG. 8 is a fifth schematic structural diagram of a cathode of an island region in a display panel according to an embodiment of the present disclosure.

FIG. 8 is a fifth schematic structural diagram of a cathode of an island region in a display panel according to an embodiment of the present disclosure. In an exemplary implementation, as shown in FIG. 8, the cathode 30 includes a first cathode part 301, a second cathode part 302, and a lapping part 305. The first cathode part 301 and the second cathode part 302 are arranged at interval along the first direction D1, the lapping part 305 is in an elongated strip shape extending along the first direction D1, and the lapping part 305 is located between the first cathode part 301 and the second cathode part 302. The first cathode part 301 and the second cathode part 302 share the lapping part 305, that is, the first cathode part 301 and the second cathode part 302 are electrically connected with the power signal lead line 7 of the lapping region 402 through the lapping part 305.

In an exemplary implementation, as shown in FIG. 8, the cathode 30 may be in an I-shape, and a light transmission region 306 is provided between the first cathode part 301 and the second cathode part 302 to reduce an evaporation area of the cathode 30 and improve the light transmittance of the display panel. In some embodiments, the cathode 30 may also be rectangular.

In an exemplary implementation, as shown in FIG. 8, the first cathode part 301 and the second cathode part 302 are both rectangular, and a minimum distance L1 between the first cathode part 301 and the second cathode part 302 is about 80 um to 100 um, for example, the minimum distance L1 is 133.5 um.

Figure 9:
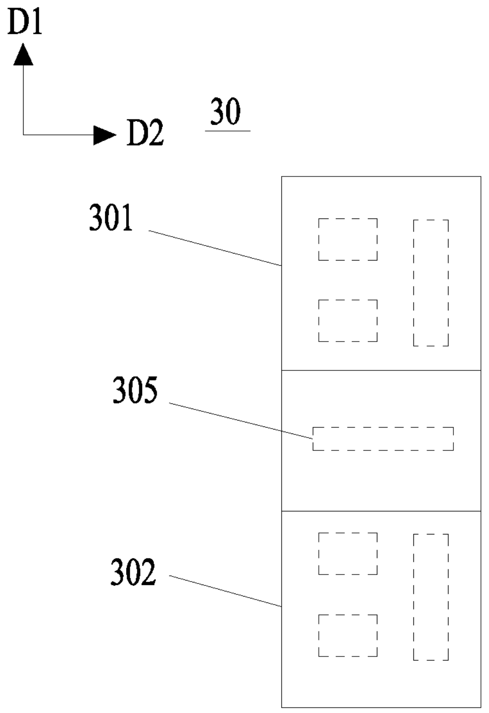
FIG. 9 is a sixth schematic structural diagram of a cathode of an island region in a display panel according to an embodiment of the present disclosure.

FIG. 9 is a sixth schematic structural diagram of a cathode of an island region in a display panel according to an embodiment of the present disclosure. In an exemplary implementation, as shown in FIG. 9, the cathode 30 includes a first cathode part 301, a second cathode part 302, and a lapping part 305. The first cathode part 301 and the second cathode part 302 are arranged at interval along the first direction D1, the lapping part 305 is in an elongated strip shape extending along the second direction D2, and the lapping part 305 is located between the first cathode part 301 and the second cathode part 302. The first cathode part 301 and the second cathode part 302 share a lapping part 305, that is, the first cathode part 301 and the second cathode part 302 are electrically connected with the power signal lead line 7 of the lapping region 402 through a lapping part 305. Among them, the first direction D1 intersects with the second direction D2, for example, the first direction D1 is perpendicular to the second direction D2. In some embodiments, an orthographic projection of the lapping part on the base substrate is in a cross-shape.

In an exemplary implementation, as shown in FIG. 9, the cathode 30 may be rectangular, a length of the cathode 30 is about 450 μm to 550 um, for example, the length of the cathode 30 is about 501.5 um. A width of the cathode 30 is about 150 μm to 200 um, for example, the width of the cathode 30 is about 184 um.

Figure 10:
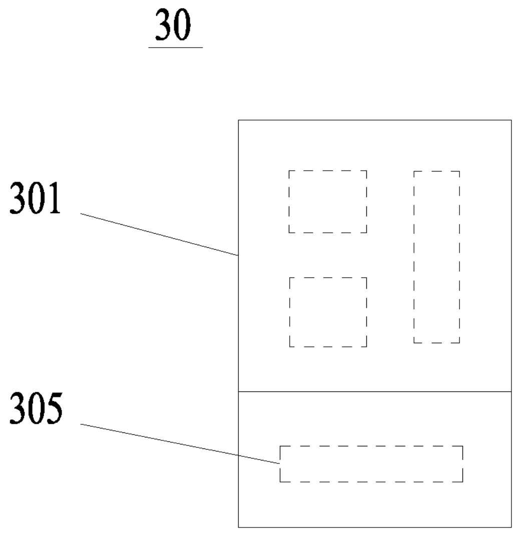
FIG. 10 is a seventh schematic structural diagram of a cathode of an island region in a display panel according to an embodiment of the present disclosure.

FIG. 10 is a seventh schematic structural diagram of a cathode of an island region in a display panel according to an embodiment of the present disclosure. In an exemplary implementation, as shown in FIG. 10, the cathode 30 includes a cathode part 301 and a lapping part 305. The lapping part 305 is located on a side of the cathode part 301. The cathode part 301 is electrically connected with the power signal lead line 7 of the lapping region 402 through the lapping part 305.

In an exemplary implementation, the lapping part is in an elongated strip shape extending along the first direction D1, or the lapping part is in an elongated strip shape extending along the second direction D2, or an orthographic projection of the lapping part on the base substrate is in a cross-shape.

In an exemplary implementation, the cathode 30 may be rectangular and a ratio of a length to a width of the cathode 30 is 3 to 1. For example, a length of the cathode 30 is about 450 μm to 250 um and a width is about 150 μm to 200 um.

Figure 11:
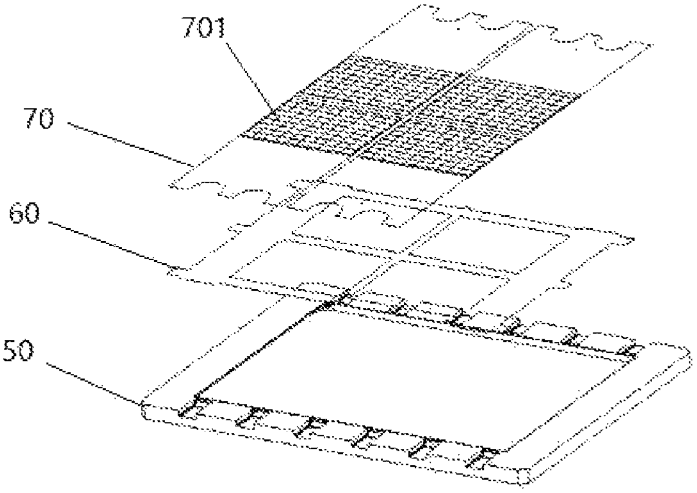
FIG. 11 is an exploded diagram of a mask according to an embodiment of the present disclosure.
Figure 12:
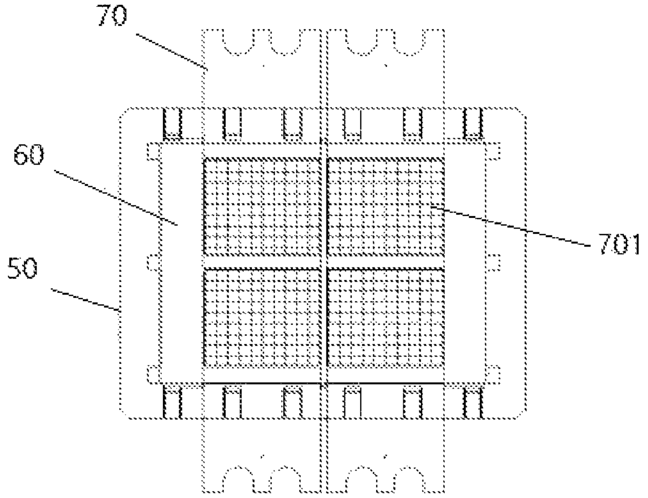
FIG. 12 is a schematic structural diagram of a mask according to an embodiment of the present disclosure.

FIG. 11 is an exploded diagram of a mask according to an embodiment of the present disclosure. FIG. 12 is a schematic structural diagram of a mask according to an embodiment of the present disclosure. As shown in FIG. 11 and FIG. 12, an embodiment of the present disclosure further provides a mask, the mask is used for manufacturing the cathode in the aforementioned display panel, the mask includes a frame 50, a support mask 60 disposed on the frame 50, and a fine metal mask 70 disposed on a side of the support mask 60 away from the frame 50. The fine metal mask 70 includes at least one opening pattern region 701, each of the at least one opening pattern region has a same shape as a shape of the cathode in the aforementioned display panel.

An embodiment of the present disclosure further provides a display device, including any one of the display panel described above. The display device includes a mobile phone, a tablet computer, a wearable smart product (such as a smart watch, a bracelet, or the like), a personal digital assistant (PDA), a vehicle-mounted computer, or the like. A specific form of the above display device is not specially limited in the embodiments of the present application.

The drawings of the present disclosure only involve structures involved in the present disclosure, and other structures may be referred to conventional designs. The embodiments of the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display panel, comprising a base substrate;

a plurality of island regions which are disposed on the base substrate and are spaced apart from each other;

hole regions disposed between adjacent island regions and bridge regions connecting adjacent island regions, each of the plurality of island regions comprises a structural film layer disposed on the base substrate; and a cathode disposed on a side of the structural film layer away from the base substrate, wherein the structural film layer comprises at least one effective light emitting region and at least one lapping region, the cathode comprises at least one cathode part and at least one lapping part, wherein an orthographic projection of the at least one cathode part on the base substrate is overlapped with an orthographic projection of the at least one effective light emitting region on the base substrate, and an orthographic projection of the at least one lapping part on the base substrate is overlapped with an orthographic projection of the at least one lapping region on the base substrate.

2. The display panel according to claim 1, wherein the cathode comprises a cathode part and a lapping part, and the lapping part is located at a side of the cathode part.

3. The display panel according to claim 2, wherein the cathode is rectangular.

4. The display panel according to claim 3, wherein a ratio of a length to a width of the cathode is 3 to 1.

5. The display panel according to claim 4, wherein a length of the cathode is 450 um to 550 um and a width of the cathode is 150 um to 200 um.

6. The display panel according to claim 1, wherein the cathode comprises a first cathode part, a second cathode part and a lapping part, the first cathode part and the second cathode part are arranged at interval along a first direction, the lapping part is located between the first cathode part and the second cathode part, and the first cathode part and the second cathode part share the lapping part.

7. The display panel according to claim 6, wherein the lapping part is in an elongated strip shape extending along a second direction, and the first direction intersects with the second direction.

8. The display panel according to claim 7, wherein the cathode is in an I-shape.

9. The display panel according to claim 8, wherein the first cathode part and the second cathode part are both rectangular, and a minimum distance between the first cathode part and the second cathode part is 80 um to 100 um.

10. The display panel according to claim 7, wherein the cathode is rectangular.

11. The display panel according to claim 6, wherein the lapping part is in an elongated strip shape extending along the first direction.

12. The display panel according to claim 6, wherein the cathode is rectangular.

13. The display panel according to claim 1, wherein the cathode comprises a first cathode part, a second cathode part, a third cathode part, a fourth cathode part, and a lapping part, the first cathode part and the second cathode part are arranged at interval along a first direction to form a first column of cathode parts, the third cathode part and the fourth cathode part are arranged at interval along a first direction to form a second column of cathode parts, the first column of cathode parts and the second column of cathode parts are arranged at interval along a second direction, the lapping part is located between the first column of cathode parts and the second column of cathode parts, the first cathode part, the second cathode part, the third cathode part, and the fourth cathode part share the lapping part, and the first direction intersects with the second direction.

14. The display panel according to claim 13, wherein the lapping part is in an elongated strip shape extending along the first direction; or, the lapping part is in an elongated strip shape extending along the second direction; or, an orthographic projection of the lapping part on the base substrate is in a cross-shape.

15. The display panel according to claim 13, wherein a light transmission region is provided in at least one of following locations: between the first cathode part and the second cathode part, between the second cathode part and the third cathode part, between the third cathode part and the fourth cathode part, and between the fourth cathode part and the first cathode part.

16. The display panel according to claim 1, wherein the at least one effective light emitting region comprises a drive circuit layer disposed on the base substrate, an organic dielectric layer disposed on a side of the drive circuit layer away from the base substrate, an anode disposed on a side of the organic dielectric layer away from the base substrate, and a light emitting layer disposed on a side of the anode away from the base substrate, the at least one cathode part is electrically connected with the anode, the anode is connected with the drive circuit layer.

17. The display panel according to claim 16, wherein the at least one effective light emitting region further comprises an organic common layer, the organic common layer is located on a side of the light emitting layer away from the base substrate, and an orthographic projection of the organic common layer on the base substrate is not overlapped with the orthographic projection of the at least one lapping region on the base substrate.

18. The display panel according to claim 1, wherein the at least one lapping region comprises an organic dielectric layer disposed on the base substrate, a power signal lead line disposed on a side of the organic dielectric layer away from the base substrate, and the at least one lapping part is electrically contacted with the power signal lead line.

19. A display device, comprising the display panel according to claim 1.

20. A mask configured to manufacture a cathode in the display panel according to claim 1, the mask comprises a frame, a support mask disposed on the frame, and a fine metal mask disposed on a side of the support mask away from the frame, wherein the fine metal mask comprises at least one opening pattern region, each of the at least one opening pattern region has a same shape as a shape of the cathode.

* * * * *